(12) United States Patent
Bennett et al.

(10) Patent No.: US 10,374,330 B1
(45) Date of Patent: Aug. 6, 2019

(54) WINDOW ASSEMBLY WITH SOLDERLESS ELECTRICAL CONNECTOR

(71) Applicant: AGC Automotive Americas R&D, Inc., Ypsilanti, MI (US)

(72) Inventors: Daniel Bennett, Tecumseh, MI (US); Christopher A. Imeson, LaSalle (CA)

(73) Assignee: AGC Automotive Americas R&D, Inc., Ypsilanti, MI (US)

( * ) Notice: Subject to any disclaimer, the term of this patent is extended or adjusted under 35 U.S.C. 154(b) by 0 days.

(21) Appl. No.: 15/981,938

(22) Filed: May 17, 2018

(51) Int. Cl.
*H01R 13/24* (2006.01)
*H01R 4/28* (2006.01)
*H01R 13/11* (2006.01)
*H01R 13/187* (2006.01)
*H01R 4/64* (2006.01)
*B60J 1/00* (2006.01)
*H05K 1/02* (2006.01)
*H05B 3/84* (2006.01)
*H05B 3/86* (2006.01)

(52) U.S. Cl.
CPC ............... *H01R 4/28* (2013.01); *H01R 4/64* (2013.01); *H01R 13/111* (2013.01); *H01R 13/187* (2013.01); *H01R 13/2414* (2013.01); *B60J 1/00* (2013.01); *H01R 2201/26* (2013.01); *H05B 3/84* (2013.01); *H05B 3/86* (2013.01); *H05K 1/0212* (2013.01)

(58) Field of Classification Search
CPC .. H01R 13/2414; H01R 2201/26; H05B 3/84; H05B 3/86
See application file for complete search history.

(56) References Cited

U.S. PATENT DOCUMENTS

| | | | | |
|---|---|---|---|---|
| 6,164,984 | A | * | 12/2000 | Schreiner ............. H01Q 1/1271 439/86 |
| 9,520,665 | B2 | * | 12/2016 | Takeuchi ................. H01R 4/04 |
| 2010/0212959 | A1 | * | 8/2010 | Flick ................. B32B 17/10036 174/84 R |
| 2018/0287294 | A1 | * | 10/2018 | Imeson .................. H01R 4/023 |

* cited by examiner

*Primary Examiner* — Tho D Ta
(74) *Attorney, Agent, or Firm* — Quinn IP Law

(57) ABSTRACT

A window assembly includes a transparent substrate, an electrical conductor provided on a surface of the substrate, and a solderless electrical connector for energizing the electrical conductor. The solderless electrical connector includes a cover adhered to the substrate to define a hollow volume, and a biasing member disposed within the hollow volume and elastically compressed between the cover and the electrical conductor. The biasing member is formed from a polymeric material and is electrically conductive.

20 Claims, 5 Drawing Sheets

US 10,374,330 B1

WINDOW ASSEMBLY WITH SOLDERLESS ELECTRICAL CONNECTOR

TECHNICAL FIELD

The present disclosure relates generally to window assemblies, and more specifically to a window assembly with an electrically insulated, solderless electrical connector.

BACKGROUND

Window assemblies for vehicles are often functionalized to include one of more electrical components disposed on the transparent substrate. These electrical components may include, for example, RF antennae or resistive heating elements. An external electrical connection is typically made with these electrical components via a wiring harness that is connected to a printed silver circuit on the glass via an electrical connection element. In typical applications, the electrical connection element is both mechanically and electrically bonded to the printed silver circuit and underlying transparent substrate through a solder joint that is formed between the connection element and the silver circuit.

While lead-based solder has typically been the standard material used to create solder joints, various corporate practices and international agreements have restricted the use of lead-based solders. Unfortunately, lead-free alternative solders generally have lower mechanical strength and thermal stability than comparable lead-based solders. Furthermore, better performing lead-free solders typically are composed of one or more rare earth metals, such as Indium, that are, at times in scare supply.

As such, there is a need for a means of reliably attaching an electrical connection element to a silver circuit on a glass window substrate that does not rely on lead-free solders.

While this provided background description attempts to clearly explain certain club-related terminology, it is meant to be illustrative and not limiting.

DETAILED DESCRIPTION

Figure 1:
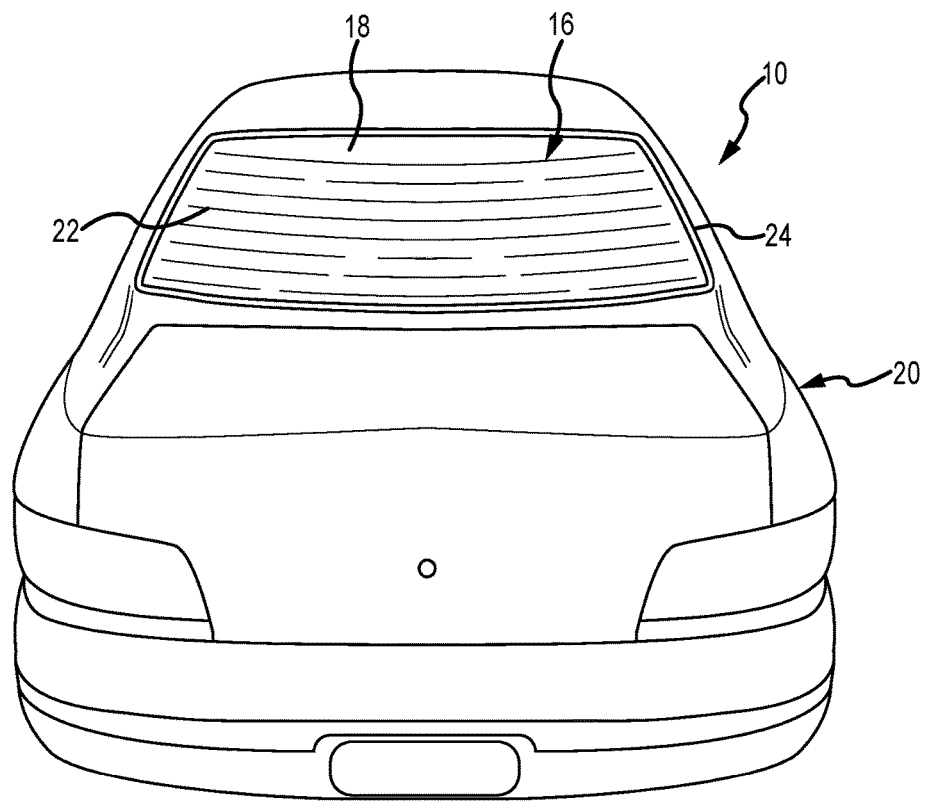
FIG. 1 is a schematic rear perspective view of a window assembly illustrated in an operational relationship with a vehicle.

The present embodiments discussed below are directed to a solderless electrical connector that may supply electrical power to a circuit disposed on a transparent substrate such as a window. Instead of solder, the present design utilizes a strong adhesive to mechanically bind a cover to the substrate. Between the cover and the substrate is a compressed, electrically conductive, compliant member, such as a foam, that applies a contact pressure to force an electrically conductive surface against the substrate. In doing so, the compliant, compressible member follows the contours of the substrate and forms an electrical connection across an area, which can inherently transmit a greater current than simply a point contact, such as may be provided by a spring tab. Furthermore, the present design addresses upcoming prohibitions on leaded solder without the need to rely on exotic rare earth metals or the need to compromise strength.

"A," "an," "the," "at least one," and "one or more" are used interchangeably to indicate that at least one of the item is present; a plurality of such items may be present unless the context clearly indicates otherwise. All numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; about or reasonably close to the value; nearly). If the imprecision provided by "about" is not otherwise understood in the art with this ordinary meaning, then "about" as used herein indicates at least variations that may arise from ordinary methods of measuring and using such parameters. In addition, disclosure of ranges includes disclosure of all values and further divided ranges within the entire range. Each value within a range and the endpoints of a range are hereby all disclosed as separate embodiment. The terms "comprises," "comprising," "including," and "having," are inclusive and therefore specify the presence of stated items, but do not preclude the presence of other items. As used in this specification, the term "or" includes any and all combinations of one or more of the listed items. When the terms first, second, third, etc. are used to differentiate various items from each other, these designations are merely for convenience and do not limit the items.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

Other features and aspects will become apparent by consideration of the following detailed description and accompanying drawings. Before any embodiments of the disclosure are explained in detail, it should be understood that the disclosure is not limited in its application to the details or construction and the arrangement of components as set forth in the following description or as illustrated in the drawings. The disclosure is capable of supporting other embodiments and of being practiced or of being carried out in various ways. It should be understood that the description of specific embodiments is not intended to limit the disclosure from covering all modifications, equivalents and alternatives falling within the spirit and scope of the disclosure. Also, it is to be understood that the phraseology and terminology used herein is for the purpose of description and should not be regarded as limiting.

Referring to the drawings, wherein like reference numerals are used to identify like or identical components in the various views, FIG. 1 schematically illustrates a window assembly 10 having a solderless electrical connector 12 that mechanically and electrically couples a wiring harness 14 with a conductive circuit 16 disposed on a transparent/glass substrate 18. The window assembly 10 may be used within an automotive context, such as in an automotive vehicle 20, where one or more electrical components 22 are desirably integrated into or directly coupled with the transparent substrate 18. For example, as generally illustrated in FIG. 1, the electrical component 22 may include one or more resistive heaters operative to locally heat and/or defrost a portion of the transparent substrate 18. Additionally, or alternatively, the one or more electrical components may include one or more RF antennae, led lights, camera modules, or other such electrical devices.

In most embodiments, the transparent substrate 18 may include a pane of silica glass. In some embodiments, a glass substrate 18 may include various additives to alter the transmissivity of the pane, for example, to provide various levels of tint or coloration. Furthermore, in some embodiments, the transparent substrate 18 may be a laminate that includes one or more layers of both a silica glass and of a polymeric material such as polymethyl methacrylate, polycarbonate, polyvinyl butyral, or the like. In some embodiments, the substrate 18 may alternatively be a polymeric substrate that is entirely made from a transparent polymeric material such as polymethyl methacrylate, polycarbonate, polyvinyl butyral, or the like.

The conductive circuit 16 disposed on the transparent substrate may comprise one or more electrical conductors 24 or wires that are bonded to or integrally formed as an outer layer of the substrate 18. The one or more electrical conductors 24 may include, for example, a conductive layer of silver. In other embodiments, the electrical conductor 24 may be made of other conductive metals and/or other conductive or nonconductive materials in addition to, or instead of, silver. The electrical conductor 24 may be a film, a coating, and/or may take any other form so long as the electrical conductor 24 is conductive and serves any function known in the art for such electrical conductors. The electrical conductor 24 may be porous and/or nonporous. In various embodiments, the electrical conductor 24 is a porous silver film. In other embodiments, the electrical conductor 24 may be printed, for example, a screen printed silver film or printed silver circuit.

The conductive circuit 16 and electrical conductor 24 may be an electrical extension of, or may be electrically coupled with the electrical component 22. The conductive circuit 16 may further include one or more bus bars (not shown), resistors, or similar electrical components. It should be appreciated that the wire harness 14 may transfer power from a separate power supply (not shown) to the conductive circuit 16.

Figure 2:
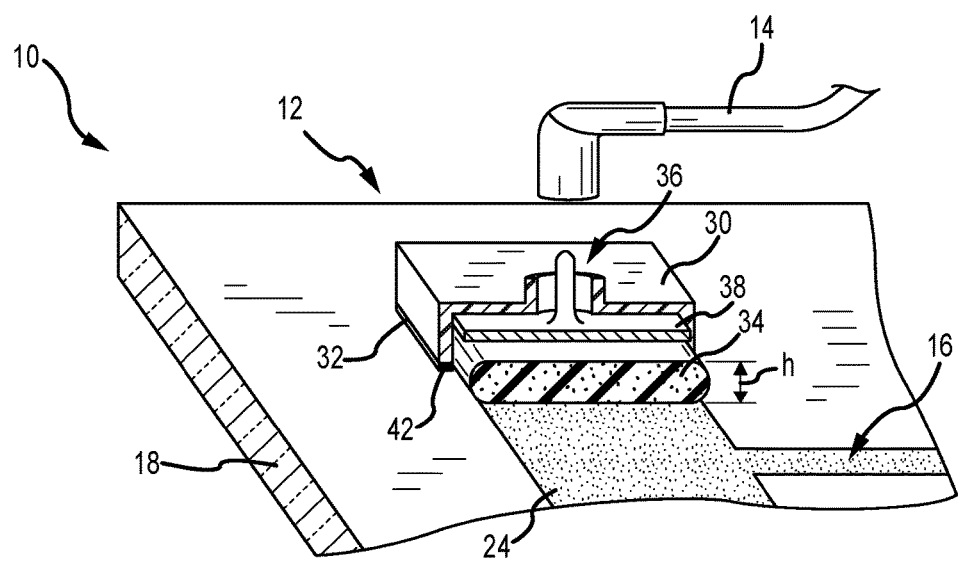
FIG. 2 is a schematic partial cross-sectional view of an embodiment of a solderless electrical connector attached to a transparent substrate.
Figure 3:
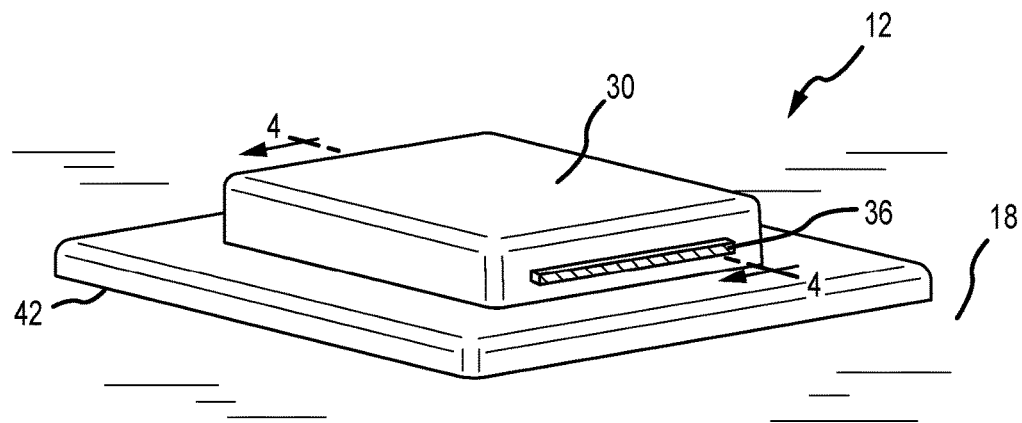
FIG. 3 is a schematic isometric view of an embodiment of a solderless electrical connector attached to a transparent substrate.
Figure 4:
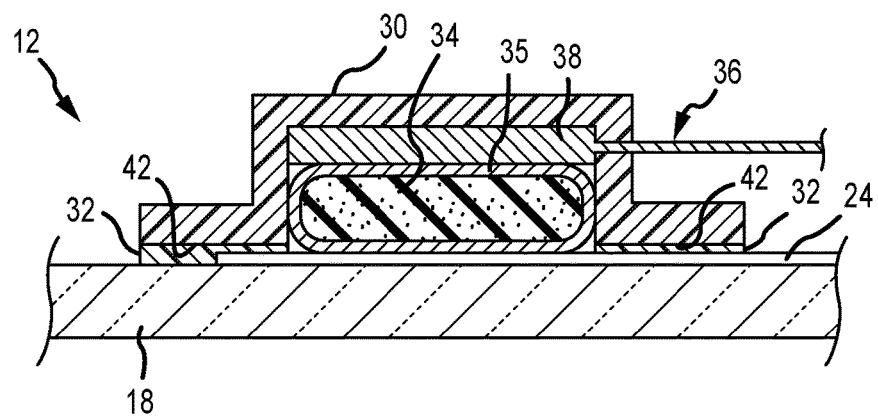
FIG. 4 is a schematic cross-sectional view of the solderless electrical connector of FIG. 3, taken along line 4-4.

FIGS. 2-4 generally illustrate two embodiments of a solderless electrical connector 12 that mechanically and electrically connects the wiring harness 14 to the conductive circuit 16 disposed on the substrate 18. In both embodiments, the solderless electrical connector 12 includes a cover 30, an adhesive 32, and an electrically conductive, elastically compressible biasing member 34. In some embodiments, the solderless electrical connector 12 may further include one or more connection elements 36 that facilitate an electrical connection with the wiring harness 14, and/or a charge distributing plate 38 disposed between the biasing member 34 and the cover 30.

In a general sense, the solderless electrical connector 12 utilizes the elastic compliance of the biasing member 34 to create an electrical contact with the substrate 18 across an area. More specifically, in contrast with a mechanical contact tab or spring may that may contact the surface at only a few discrete points, the present design may establish contact across a great multitude of points (at a microscopic level), which more closely resembles a true surface-to-surface contact. In doing so, the electrical resistance of the juncture is decreased and/or the current carrying capacity of the juncture is increased.

As illustrated in FIG. 2, in an embodiment, the cover 30 may be directly bonded to the substrate 18 via the adhesive 32. The biasing member 34 may be over-dimensioned such that when the cover 30 is firmly affixed to the substrate 18, the biasing member 34 is elastically compressed between the cover 30 and the substrate 18 (i.e., the height/thickness h, measured normal to the surface of the substrate 18 is compressed between the cover 30 and the substrate 18). In doing so, the elastic restorative force and resulting contact pressure from the compressed biasing member 34 may directly encourage robust electrical contact between the connector 12 and the circuit 16.

The cover 30 may be a substantially hollow and/or concave vessel that cooperates with the substrate 18 to define an internal connector volume. Functionally, the cover 30 may encapsulate the electrical connection formed with the circuit 16 to both protect the integrity of the connection and inhibit foreign objects or fluids from contacting and/or degrading the interface. In some embodiments, the cover 30 may be formed from a polymer or polymeric material, which may provide electrical insulation about the joint. The polymer cover may comprise one or more thermoplastic materials and/or thermoset materials. Non-limiting examples of suitable polymers include thermoplastic elastomers (TPE), thermoplastic vulcanizates (TPV), and thermoplastic polyolefins (TPO). Specific non-limiting examples include thermoplastic styrene (TPS), polyurethane, polyvinyl chloride (PVC), Acetal, acrylic, polyamide (PA6 or PA66), Polytetrafluoroethylene (PTFE), and ester based thermoplastic elastomers (E-TPE). It should also be appreciated that the cover 30 may be made of non-polymeric materials.

As noted above, one or more connection elements 36 may extend through the cover 30 to facilitate the mechanical and/or electrical connection between the wire harness 14 and the electrical connector 12. The one or more connection elements 36 may include one or more male or female electrical junctures, one or more mechanical clips, and/or one or more keyed surfaces that may facilitate the interconnection of a suitable wiring harness terminal adapter with the connector 12. The one or more connection elements 36 may further include one or more conductive posts, studs, wire leads, tabs, tapes, films, or other conductive elements that may conduct electricity from the wire harness 14 to the connector 12 and which may be used in some embodiments to directly or indirectly facilitate the mechanical connection.

With continued reference to FIGS. 2-4, to facilitate the actual electrical joint with the substrate 18 and/or circuit 16, an electrically conductive, elastically compressible biasing member 34 may be positioned within the connector volume and held in forcible contact with the electrical conductor 24/substrate 18 by the cover 30. The biasing member 34 may be dimensioned such that it has a height h, measured normal to the surface of the substrate 18, that is greater when in an undeformed state than a similar height of the volume. In one embodiment, the biasing member 34 may resemble a rectangular cuboid shape with six rectangular and/or square external faces.

In one embodiment, the biasing member 34 may comprise a polymeric and/or elastomeric material that resists taking a compression set over time and maintains some degree of functional elasticity across a temperature range of from about −40 degrees Celsius to about 120 degrees Celsius. In some embodiments, the polymeric material may comprise a foam, such as an open celled foam or a closed cell foam. In some embodiments, the polymeric and/or elastomeric material may comprise, for example, a polyurethane, a rubber (e.g., a rubber formed from an ethylene propylene diene monomer (EPDM)), or a polystyrene.

As noted above, in order to facilitate the electrical connection with the circuit 16, the biasing member 34 should be electrically conductive. As illustrated in FIG. 2, the electrical conductivity may be provided by the polymer itself (i.e., an intrinsically conductive polymer), by a conductive filler that is disbursed throughout the polymer, and/or, as shown in FIG. 4, by a conductive skin 35 that is disposed on an exterior surface of the biasing member 34. In an embodiment utilizing a conductive filler, the conductive filler can be selected from various conductive fillers understood in the art, such as metal or carbon filler, which can be in various forms such as powder or fibers. In certain embodiments, the conductive filler comprises metal, e.g. a metal powder.

In an embodiment utilizing a conductive skin 35, the conductive skin 35 may comprise a foil layer that is conductive and flexible disposed about the compressible material. The foil layer may have a thickness that is less than 25% of the thickness h of the compressible material 34. In some embodiments, the foil layer may have a thickness of from about 0.001 mm to about 2 mm or from about 0.01 mm to about 1 mm. In some embodiments, the conductive skin/foil layer 35 may entirely encapsulate the compressible member 34. In some embodiments, the conductive skin 35 may entirely provide the conductive properties to the compressible material (i.e., the biasing member 34 may not be electrically conductive absent the skin). The conductive skin 35 may be formed from conductive metal such as aluminum, copper, brass, silver, gold, nickel, tin, carbon-based compounds, or combinations thereof. In certain embodiments, the conductive skin 35 may be made from a fabric-reinforced metal film, such as fabric-reinforced aluminum.

As noted above, the cover 30 may be secured in place over the biasing member 34 by directly adhering it to the substrate 18 via the adhesive 32. More specifically, as shown in FIGS. 2 and 4, the adhesive 32 may be disposed between an outer peripheral edge or surface 42 of the cover 30 and the substrate 18. To eliminate the need for complex fixturing, it is preferable for the adhesive 32 to cure via one or more means that do not require thermal initiation. Said another way, while the use of thermally curing adhesives may be efficient in some specific applications, it may also present a need for complex fixturing within an oven or autoclave that may be prohibitive in other applications. To address this issue, the adhesive 32 used to secure the cover to the substrate 18 may be cured (or the curing may be initiated) through a non-thermal means, such as, for example, through the use of ultra-violet radiation that may be applied with the aid of a small hand-held light.

Depending on the amount of power that is intended to be passed through the electrical connector 12, it may be beneficial to include a charge distributing plate 38 between the cover 30 and the biasing member 34. Absent this plate, it has been found that the charge density can be rather localized across the biasing member 34, which can prove undesirable.

The charge distributing plate 38 may include a solid piece of a conductive metal, such as copper, that extends across the entire upper surface of the biasing member 34. In some embodiments, the charge distributing plate may be integral to at least one of the outer surface of the biasing member 34 or the inner surface of the cover 30. In one embodiment, the entire cover 30 may be metallic/conductive and may serve a dual function as the cover 30 and the charge distributing plate 38. The charge distributing plate 38 may be particularly useful to facilitate an electrical connection between the one or more connection elements 36 extending through the cover 30 and the compressible biasing member 34. For example, while it may be difficult to form a reliable electrical connection directly with a conductive foam, the charge distributing plate 38 replaces an otherwise localized point contact with an electrical contact over a larger area. Additionally, it provides a more rigid means for securing or providing an electrical connection element 36.

Figure 5:
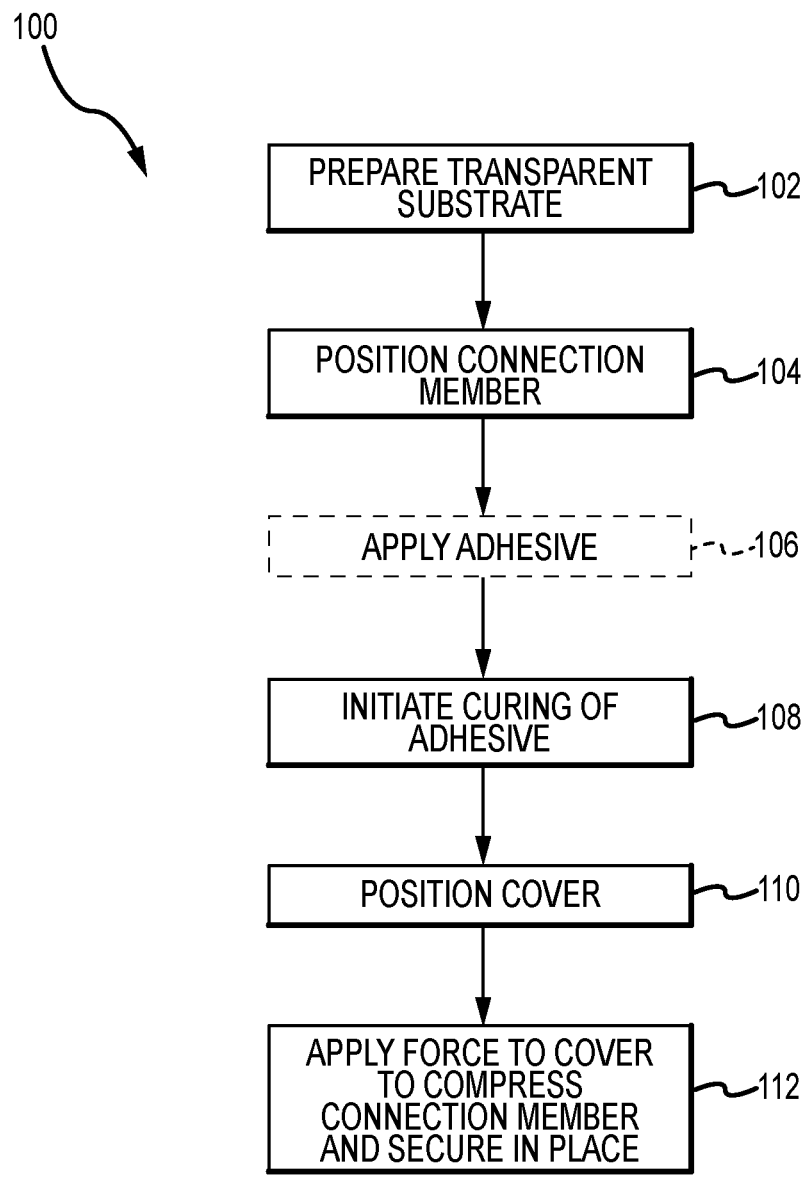
FIG. 5 is a schematic flow diagram of a method of making a solderless electrical connection with an electrical conductor disposed on a transparent substrate.

FIG. 5 schematically illustrates a method 100 of making a solderless electrical connection with an electrical conductor 24 disposed on a transparent substrate 18. As shown, in step 102, the method 100 generally begins by preparing the transparent substrate 18 to include an integral electrical conductor 24 and a circuit 16. This step may include any needed heat-treating processes, laminating processes, autoclaving processes, tempering processes, screen printing of circuitry, and any other such processes that may necessarily be performed to the substrate 18 and/or circuit 16.

In step 104, an electrically conductive biasing member 34 is positioned in a contacting and abutting relationship to the electrical conductor 24. In step 106, an adhesive 32 is applied to a peripheral edge/surface 42 of an electrically insulating cover 30 that is intended to make contact with the substrate 18. It should be noted that such an applying step may be omitted (illustrated by the dashed boundary) contingent on whether the cover 30 is initially procured with the adhesive already applied.

In step 108, curing of the adhesive is initiated by applying a stimulus. In one embodiment, the curing is photoinitiated, such as by exposing the adhesive momentarily to an ultraviolet light source. In such an embodiment, the curing process should be self-sustaining once externally initiated, yet should be slow enough to provide some minimum amount of working time (e.g., greater than about 20 seconds) so that an assembly technician can perform the remaining steps. In one example, this self-sustaining curing may be facilitated by providing one or more of a catalyst and an initiator within a plurality of photo-sensitive micro capsules that may release the catalyst and/or initiator upon exposure to a light source such as an ultraviolet lamp.

In step 110, the cover 30 with initiated adhesive 32 may be positioned in a surrounding arrangement around the biasing member 34. And finally in step 112, force may be applied to the cover 30 to compress the biasing member 34 in a direction normal to the surface of the substrate 18 until the adhesive 32 contacts the substrate 18. In one embodiment, the force may be maintained for a sufficient amount of time until the adhesive can resist the elastic expansion of the biasing member 34. In a more preferred embodiment, however, the green strength of the adhesive (i.e., the initial contact bonding strength) should exceed the amount of force exerted by the elastically compressed biasing member 34 such that the compressed biasing member 34 may be held in an elastically deformed state upon initial contact between the adhesive 32 and the substrate 18. In such an embodiment, the cover 30 need not be held in place or externally fixtured after initial assembly, which may reduce the cost and complexity of the assembly.

While FIG. 5 schematically illustrates an assembly method 100 that includes momentarily exposing the adhesive to a cure-initiating stimulus (at step 108), in another embodiment, the stimulus may be applied continuously throughout the curing process after the cover 30 is applied to the substrate 18 (i.e., in step 112). Such a technique has additional limitations since it may only be applicable if the location of the adhesive was on a transparent portion of the substrate (i.e., transparent to whatever stimulus is being applied). This may not be feasible in many cases due to typical black masking layers that are used to improve the aesthetics by eliminating the ability to see circuitry and connections. If the adhesive is visible through the substrate, however, then the method may include applying the cover 30 to a portion of the substrate 18 that is transparent to ultraviolet light, and exposing the adhesive to the stimulus to the ultraviolet through the opposite side of the substrate 18 to cure the adhesive 32.

Figure 6:
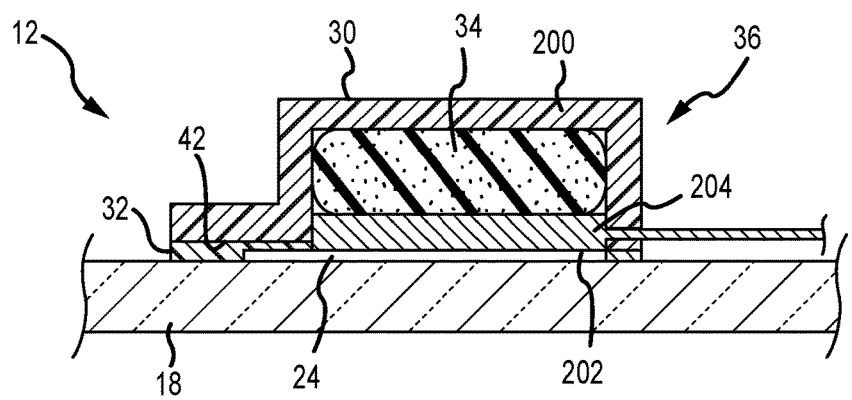
FIG. 6 is a schematic cross-sectional view of an embodiment of a solderless electrical connector attached to a transparent substrate.
Figure 7:
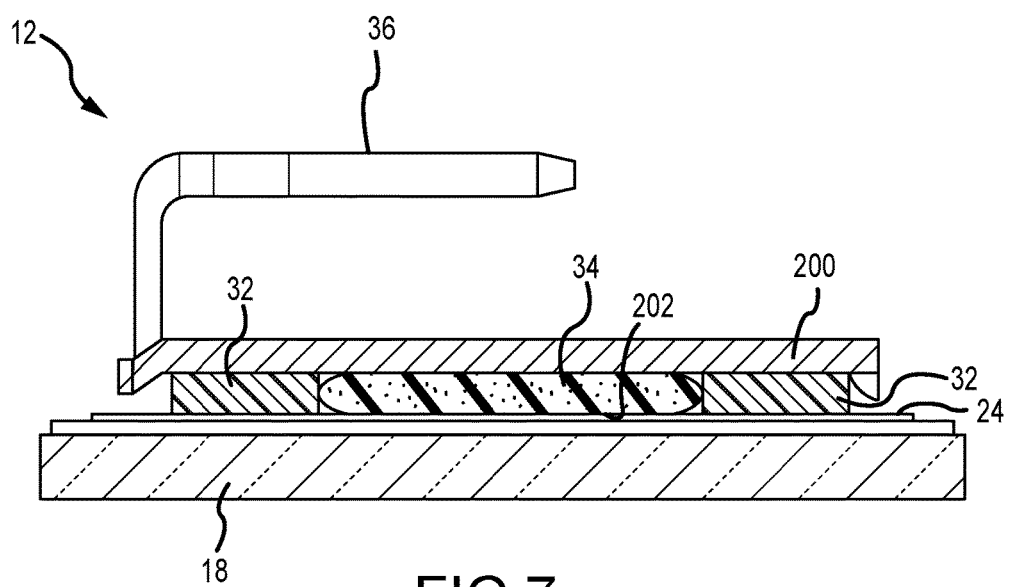
FIG. 7 is a schematic cross-sectional view of an embodiment of a solderless electrical connector attached to a transparent substrate.

FIGS. 6 and 7 illustrate two additional embodiments that rely on an adhesive to hold the compressed biasing member 34 in its elastically deformed state. In both embodiments, much like as illustrated in FIGS. 2-4, a biasing member 34 is elastically compressed between an outer plate 200 and the transparent substrate 18.

In each case, the biasing member 34 urges an electrically conductive surface 202 into contact with an electrical conductor 24 provided on an outer surface of the substrate 18. In FIG. 6, the biasing member 34 may simply apply a uniform spring force against an electrical contact plate 204, without necessarily conducting any electricity itself. In this embodiment, the electrically conductive surface 202 is an outer surface of the electrical contact plate 204. If the electrical contact plate 204 is not sufficiently compliant or complimentary to the outer surface of the substrate 18, an electrically conductive grease/viscous fluid may be provided between the electrical contact plate 204 and the electrical conductor 24 to improve the connection.

In FIG. 7, much like FIGS. 2-4, the biasing member 34 may either be intrinsically electrically conductive, or it may include an electrically conductive skin. In this embodiment, the electrically conductive surface 202 would then be an outer surface of the biasing member 34. To facilitate a low resistance connection, it is preferable for the electrically conductive surface 202 to be held in contact with the electrical conductor 24 across an area that is greater than about 25 mm$^2$, or greater than about 50 mm$^2$, or even greater than about 75 mm$^2$. In one embodiment (of any of the designs in FIGS. 2-4, 7), it may be possible to include an electrically conductive grease/viscous fluid between the electrical contact 204 and the electrical conductor 24 to improve the connection.

In each embodiment, to maintain the biasing member 34 in its elastically deformed/compressed state, the outer plate 200 is operatively coupled to the substrate via an adhesive 32. In FIG. 6, the outer plate 200 may be a portion of an electrically insulating cover 30, such as also illustrated in FIGS. 2-4. FIG. 7, however, illustrates an embodiment where the outer plate 200 is a conductive element that includes one or more connection elements 36 to facilitate an electrical connection with a wiring harness (not shown).

As discussed above, in a preferred embodiment, the chosen adhesive 32 should have a green strength that is sufficient to maintain the biasing member in the elastically deformed state without the need for external fixturing during the curing process.

The present solderless connector 12 advantageously eliminates the need for solder by applying an elastic contact pressure between both the substrate 18 and the outer plate 200/cover 30. It relies on a robust adhesive to mechanically secure the connector 12 to the substrate (i.e., where the adhesive may provide an even superior and simpler bond to solder), and it relies on a compliant area-based contact to provide the electrical coupling. Such a design both eliminates the need for expensive and/or performance-compromised lead-free solders, while not introducing any thermal expansion concerns that may damage the window due to differing thermal expansion rates (since the biasing member 34 is not rigidly attached to the substrate 18).

Benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are expressly stated in such claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

The invention claimed is:
1. A window assembly comprising:
a transparent substrate;
an electrical conductor provided on a surface of the substrate; and
a solderless electrical connector for energizing the electrical conductor, the solderless electrical connector comprising:
an electrically conductive surface in contact with the electrical conductor;
an outer plate;
a biasing member elastically compressed between the outer plate and the electrically conductive surface, wherein the compressed biasing member holds the electrically conductive surface in contact with the electrical conductor;
an electrically insulating cover including a closed end and an open end, the open end being configured to receive the biasing member therethrough; and
an adhesive disposed between the electrically insulating cover and the transparent substrate such that the electrically insulating cover is directly adhered to the transparent substrate, the adhesive operatively coupling the outer plate to the transparent substrate such that the biasing member is maintained in the elastically deformed state.

2. The window assembly of claim 1, wherein a green strength of the adhesive is sufficient to maintain the biasing member in the elastically deformed state without fixturing.

3. The window assembly of claim 1, wherein the electrically conductive surface is held in contact with the electrical conductor across an area that is greater than about 25 mm$^2$.

4. The window assembly of claim 1, wherein the electrically conductive surface is an outer surface of the biasing member.

5. The window assembly of claim 1, wherein the biasing member comprises a foam.

6. The window assembly of claim 1, wherein the outer plate is electrically conductive.

7. The window assembly of claim 5, wherein the biasing member is electrically conductive.

8. The window assembly of claim 1, wherein the adhesive is characterized by a photoinitiated curing process.

9. A window assembly comprising:
a transparent substrate;
an electrical conductor provided on a surface of the substrate; and
a solderless electrical connector for energizing the electrical conductor, the solderless electrical connector comprising:
a cover adhered to the substrate via an adhesive to define a hollow volume therebetween; and
a biasing member disposed within the hollow volume and elastically compressed between the cover and the electrical conductor, wherein the biasing member is formed from a polymeric material and is electrically conductive.

10. The window assembly of claim 9, wherein the adhesive is characterized by a photoinitiated curing process.

11. The window assembly of claim 9, further comprising a metallic charge distributing plate disposed between the biasing member and the cover.

12. The window assembly of claim 11, further comprising one or more connection elements extending through the cover and in electrical communication with the charge distributing plate.

13. The window assembly of claim 9, wherein the polymeric material comprises a foam.

14. The window assembly of claim 9, wherein the cover comprises a polymeric, electrically insulating material.

15. The window assembly of claim 9, wherein the electrical connection between the biasing member and the electrical conductor is devoid of solder.

16. The window assembly of claim 9, wherein the adhesive is a thermally cured adhesive.

17. A method of making a solderless electrical connection with an electrical conductor disposed on a transparent substrate, the method comprising:
positioning a biasing member in a contacting and abutting relationship to the electrical conductor, wherein the biasing member is electrically conductive and elastically compressible;
initiating curing of an adhesive disposed on a peripheral surface of a cover;
positioning the cover in a surrounding arrangement about the biasing member such that the biasing member is disposed between the electrical conductor and the cover, wherein the biasing member is dimensioned such that the cover does not contact the substrate or the electrical conductor if the biasing member is undeformed; and
applying a force to the cover sufficient to compress the biasing member and bring the adhesive into contact with at least one of the substrate or the electrical conductor.

18. The method of claim 17, wherein initiating curing of the adhesive includes exposing the adhesive to ultraviolet light.

19. The method of claim 17, further comprising applying the adhesive to the peripheral surface of the cover.

20. The method of claim 17, further comprising providing a metallic charge distributing plate between the biasing member and the cover.

* * * * *